United States Patent [19]

Gleason et al.

[11] 4,430,153

[45] Feb. 7, 1984

[54] METHOD OF FORMING AN RIE ETCH BARRIER BY IN SITU CONVERSION OF A SILICON CONTAINING ALKYL POLYAMIDE/POLYIMIDE

[75] Inventors: Robert T. Gleason, Burlington; Harold G. Linde, Richmond, both of Vt.

[73] Assignee: International Business Machines Corporation, Armonk, N.Y.

[21] Appl. No.: 509,516

[22] Filed: Jun. 30, 1983

[51] Int. Cl.$^3$ .................... H01L 21/306; C23F 1/02; B44C 1/22; C03C 15/00

[52] U.S. Cl. .................... 156/643; 156/644; 156/646; 156/652; 156/657; 156/659.1; 156/668; 204/192 E; 427/193

[58] Field of Search .............. 156/643, 644, 652, 655, 156/657, 659.1, 668, 628, 646, 345; 204/192 EC, 192 E; 427/38, 39, 93, 95; 430/313, 317, 316; 252/79.1

[56] References Cited

U.S. PATENT DOCUMENTS

| | | | |
|---|---|---|---|
| 4,140,572 | 2/1979 | Stein | 156/653 |
| 4,333,793 | 6/1982 | Lifshitz et al. | 156/643 |
| 4,377,734 | 3/1983 | Mashiko et al. | 156/643 X |

*Primary Examiner*—Powell William A.
*Attorney, Agent, or Firm*—Sughrue, Mion, Zinn, Macpeak and Seas

[57] ABSTRACT

A method of forming an etch barrier in the reactive ion etching of an aromatic polyamic acid/imide which comprises:

coating a surface with a layer of an aromatic polyamic acid;

at least partially curing the layer of aromatic polyamic acid to the corresponding aromatic polyimide;

in situ converting the surface layer of the aromatic polyimide to a silicon containing alkyl polyamide/imide;

applying, exposing, and developing a layer of photoresist over the silicon containing alkyl polyamide/imide to selectively expose a portion of the silicon containing alkyl polyamide/imide surface layer;

reactive ion etching the exposed portion of the surface layer of the silicon containing alkyl polyamide/imide with carbon tetrafluoride to remove the exposed portion of the silicon containing alkyl polyamide/imide surface layer;

reactive ion etching the resultant structure with an oxygen agent to etch an interconnect in the aromatic polyimide while removing the photoresist down to the silicon containing alkyl polyamide/imide surface layer; and reacting the silicon containing alkyl polyamide/imide surface layer exposed upon removal of the photoresist by the oxygen reactive ion etching to thereby convert the same to a silicon dioxide etch barrier.

1 Claim, No Drawings

METHOD OF FORMING AN RIE ETCH BARRIER BY IN SITU CONVERSION OF A SILICON CONTAINING ALKYL POLYAMIDE/POLYIMIDE

BACKGROUND OF THE INVENTION

1. Field of the Invention

The present invention relates to a method of forming an etch barrier in the reactive ion etching of an aromatic polyamic acid/polyimide.

2. Description of the Prior Art

IBM Technical Disclosure Bulletin Vol. 25, No. 2, July, 1982, pages 523 and 524 discloses a method of replacing the dianiline group in a cured polyimide with a disiloxane, disilarylene or disilalkylene group. The cured polyimide is reacted with a diamino disiloxane or diamino disilarylene or a disilalkylene in a solvent such as N-methyl-pyrrolidone.

In a paper presented at the First Technical Conference on Polyimides in November of 1982 entitled "Polyimide Siloxane for Electronic Application" by Davis et al, the use of silicone containing polyimides is disclosed which can be spin-coated for microelectronic applications. Patterning of the polyimide siloxane is accomplished by wet chemical or dry etching techniques. It is further disclosed that in pure oxygen the rate of polyimide siloxane etching is considerably less that that of other polymer films which were tested and a residue after etching remains.

In a paper at the same conference entitled "Thermal Studies of Compositional Variations of Some Novel Silicon Polyimides" Chowdhury et al., polysilicone imides are disclosed resulting from the modification of aromatic polyimides by specially equilibrated silicone blocks. The products are stated to exhibit good adhesion and electrical properties.

In a paper at the same conference entitled "Modified Polyimides by Silicon Block Incorporation" by Berger et al., copolymerization of a variety of dianhydrides with molar quantities of organic diamines and/or aminofunctional di/or polysiloxanes is disclosed. The products are stated to exhibit excellent adhesion, weatherability, good thermal cycling properties, controlled elongation, high solubility, etc.

U.S. Pat. No. 3,338,859 Green discloses silicone polyimides which are stated to have unique electrical properties as well as excellent stability.

U.S. Pat. No. 3,392,144 Holub discloses polyamide compositions prepared by reacting a phthaloyl compound with an organosilicon diamine or with a mixture of the latter and an organic diamine free of silicon. The products obtained by heat treatment of the aforesaid reaction products are stated to be useful as heat-resistant protective and insulating members.

U.S. Pat. No. 4,377,437 Taylor et al. discloses implanting ions into a material to chemically incorporate the same therein and render the same non-etchable to an oxygen plasma.

SUMMARY OF THE INVENTION

An oxygen reactive ion etch barrier can be formed in situ by converting the top layer of an aromatic polyimide to an alkylsiloxane, silalkylene, silarylene, alkoxysilane, alkoxyalkylsilane, alkoxyarylsilane or alkoxyalkylarylsilane polyamide/imide which can be subsequently reacted in an oxygen reactive ion etching step to form a silicon dioxide barrier layer.

The major object of the present invention is to provide a method of in situ forming an etch stop for the reactive ion etching of aromatic polyimides.

Major advantages of the present invention include:

Thinner layers of photoresist can be used with the etch stop barrier of the present invention;

devices can be made smaller and denser LSI and packaging is achieved;

superior control of line width is achieved.

DESCRIPTION OF PREFERRED EMBODIMENTS

The term "polyimide" when used alone herein is meant to refer to an at least partially cured aromatic polyamic acid which has been essentially cured to the corresponding aromatic polyimide but which may contain residual amounts of aromatic polyamic acid.

The term "silicon containing alkyl polyamide/imide" as used herein refers to the in situ converted polyamic acid/imide which is converted to the corresponding silicon containing alkyl polyamide and/or silicon containing alkyl polyimide, typically significantly the polyamide, depending upon conversion conditions.

In broad form, the method of the present invention for forming an etch barrier comprises:

Coating a surface with a layer of an aromatic polyamic acid;

at least partially curing the layer of aromatic polyamic acid to the corresponding polyimide;

in situ converting at least the surface of the polyimide to the corresponding silicon containing alkyl polyamide/imide;

applying, exposing, and developing a layer of a positive photoresist on the silicon containing alkyl polyamide/imide to selectively expose a portion of the surface layer of the same;

reactive ion etching the thus exposed portion of the surface layer of the silicon containing alkyl polyamide/imide to remove the exposed portions of the surface layer;

reactive ion etching the resultant structure to etch an interconnect hole through the exposed polyimide layer while removing the photoresist down to the converted silicon containing alkyl polyamide/imide surface layer; and reacting the thus exposed converted silicon containing alkyl polyamide/imide surface layer with oxygen reactive ion etching, thereby forming a silicon dioxide etch stop.

This invention does not preclude coating an underlying polyimide with an overlying silicon containing polyamic acid/polyimide to produce the same type of etch barrier.

Prior to discussing the processing sequence of the present invention, the nature of the etch barrier of the present invention and the reaction scheme involved will be discussed.

THE ETCH BARRIER

The etch barrier of the present invention is formed in situ from a silicon containing alkyl polyamide/imide whose nature is not excessively limited so long as a silicon containing linkage is present in the alkyl amide segment of the molecule thereof. Typically at least one alkyl silicon linkage is present in each repeating unit in the polymer.

With respect to the number of aromatic amine segments present, these are typically repeating units in the polyimide backbone.

Surface silicon containing alkyl polyimide layers, per the present invention, are prepared by reacting bulk or underlying polyimides with an alkyl silicon containing amine, diamine or polyamine, either alone or in a suitable polar aprotic solvent such as N-methylpyrrolidone (NMP), bis-2-methoxy-ethyl ether (diglyme) DMSO or pyridine. These newly formed silicon containing alkyl polyimides are similar to materials prepared by reacting a dianhydride such as, e.g., pyromellitic dianhydride, benzophenone tetracarboxylic acid dianhydride or other suitable dianhydrides with an equal molar amount of a silicon containing diamine such as, e.g., bis(3-aminopropyl)tetramethyl disiloxane in a casting solvent such as a polar aprotic solvent including amides, polyethers, sulfoxides or suitable mixtures thereof, a preferred solvent being NMP.

If desired, an equivalent silicon containing alkyl polyamide/imide can be formed merely by heating the desired alkyl amino silicon containing compound or a solution thereof with a preformed polyimide, such as polymer formed from pyromellitic dianhydride and oxydianiline or similar materials as referenced above.

The reactions of these two methods are set forth below for purposes of illustration; the present invention is not, of course, limited thereto.

Preferred siloxane or polysiloxane alkyl amines or aromatic linked silane alkyl amines are also illustrated below.

REACTION 1

Formation of Polymeric Silicon Containing Polyimides

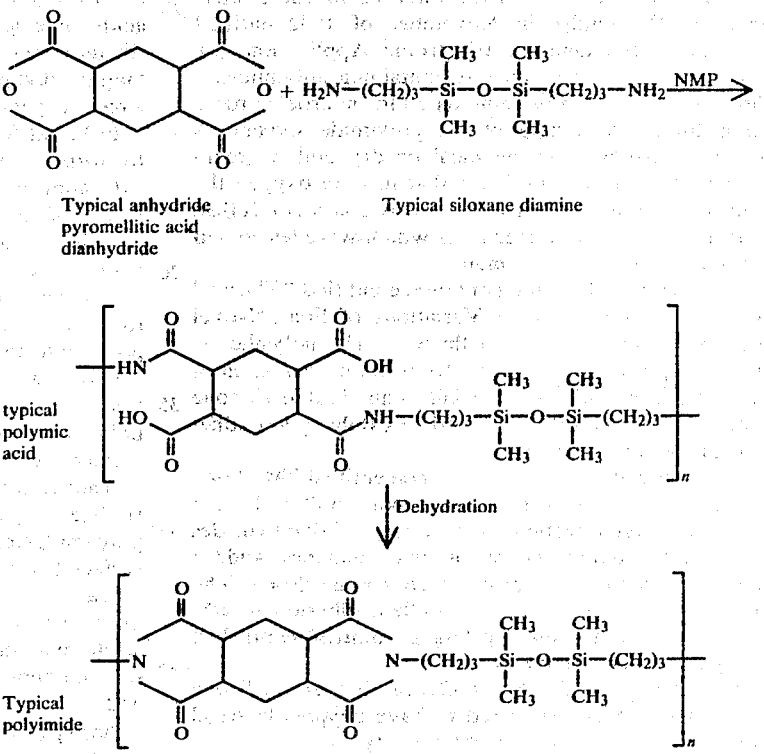

REACTION 2

Imide Displacement Reaction by Alkylamino Silicon-Containing Compound

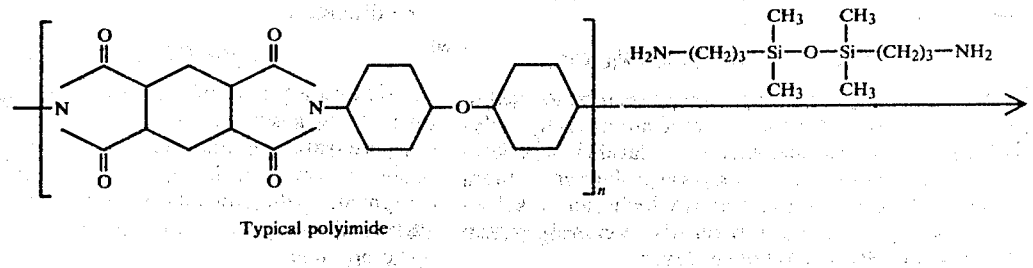

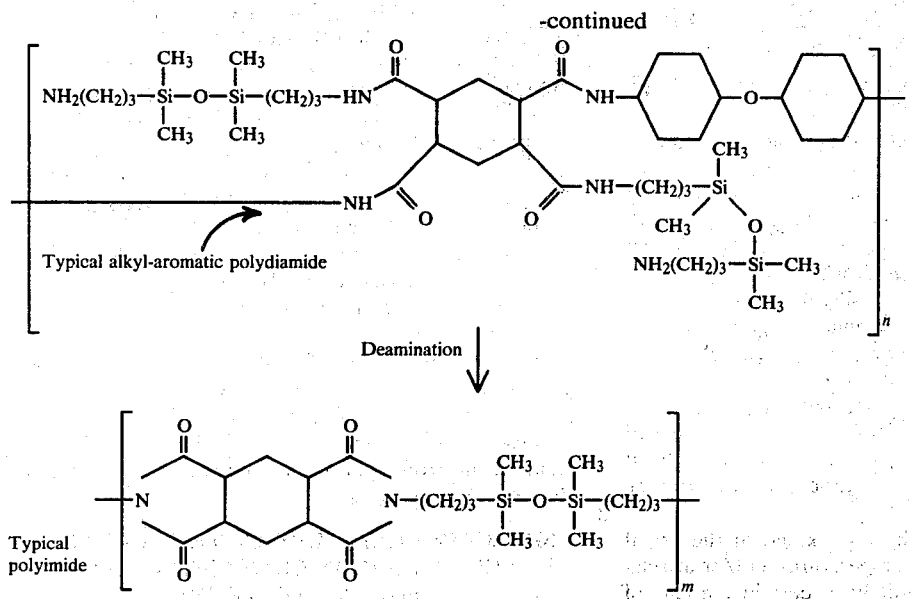

Typical alkyl-aromatic polydiamide

Deamination ↓

Typical polyimide

STRUCTURAL FORMULA OF SILICON CONTAINING ALKYLAMINES

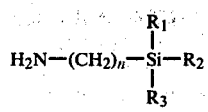

where $R_1$, $R_2$ and $R_3$ are alkyl, phenyl or o-alkyl and $R_2$ can also be "1" where "1" is

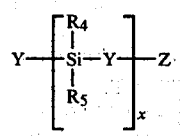

and $R_4$ and $R_5$ are alkyl or phenyl; Y is alkyl and/or aryl and/or oxygen and where Z is

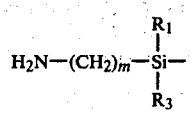

and n is from 3 to 12; m is from 3 to 12; m may, but need not equal n; and x is from 0 to 10.

With respect to any alkyl groups above, they are preferably $C_1$ to $C_6$ alkyl groups. Similarly, for any alkoxy groups, the alkyl moiety thereof is preferably a $C_1$ to $C_6$ alkyl moiety. Most preferred alkyl and alkoxy groups are methyl, ethyl, methoxy and ethoxy.

Such amines may be copolymers or mixtures of the above materials.

Having thus described the nature of the silicon containing alkyl polyamide/imide, applicants turn to a detailed description of the processing sequence of the present invention.

The Surface Coated With a Layer of Aromatic Polyimide

As will be appreciated by one skilled in the art, the nature of the surface coated with the layer of aromatic polyamic acid is not in any fashion limited so long as the aromatic polyamic acid and polyimide adhere thereto.

Typically, the surface coated is part of an electronic device which is to be selectively reactive ion etched where areas under the final silicon dioxide reactive ion etch stop are not to be reactive ion etched. Thus, the surface which is coated can comprise an organic material which is typically used as a passivating or dielectric layer in semiconductor device manufacturing such as polyimides formed from pyromellitic dianhydride and oxydianiline, or benzophenone tetracarboxylic acid dianhydride and oxydianiline, m-phenylene diamine or other aromatic polyimides or polyamide-imides known to the art or an inorganic substrate as is typically used in semiconductor manufacturer such as Si, $SiO_2$, $Si_3N_4$, metallurgy or the like.

FORMING THE LAYER OF AROMATIC POLYAMIC ACID

The layer of aromatic polyamic acid is formed in a conventional fashion. Typically it is spun onto the desired substrate in an appropriate inert solvent, e.g., N-methylpyrrolidone, partially dried and then cured to yield the desired aromatic polyimide.

Thicknesses of the aromatic polyamic acid layer are not limited, but typically will be on the order of 1.5 to 10 microns. Typically the aromatic polyamic acid layer will slightly shrink during curing, usually on the order of about 30%. Thus a polyamic acid layer 2.2 to 2.5 microns thick (thin layer application) will cure down to about 1.5 microns while a thicker layer of aromatic polyamic acid, for example, on the order or 8 to 10 microns will cure down to about 6 microns.

While not to be construed as limitative, the casting solution of the polyamic acid typically contains the desired polyamic acid in an amount of about 5 to 40% by weight of the total casting solution weight.

Aromatic polyamic acids useful in the present invention and conditions for converting the same to aromatic polyimide materials useful in the present invention are disclosed in U.S. Pat. No. 3,179,614 Edwards et al. and U.S. Pat. No. 3,264,250 Gall et al., both hereby totally incorporated by reference.

AT LEAST PARTIALLY CURING THE LAYER OF AROMATIC POLYAMIC ACID

Once the initial layer of the aromatic polyamic acid is formed as above described, it is necessary to at least partially cure the layer of polyamic acid to the corresponding polyimide.

By "at least partially cure" is meant, in the context of the present invention, that the resulting polymer will not be further attacked by or be soluble in casting solvents such as may be used in subsequent processing steps, e.g., as used to form the silicon containing alkyl polyamide/imide. Exemplary materials include cellosolve acetate, butyl acetate, diglyme, N-methyl pyrrolidone, etc., as previously described.

Curing is typically at the following conditions: A temperature of from about 100° to 400° C., a time of from about 5 to 120 minutes and at normal ambient pressure (sub- or super-atmospheric pressures can be used).

As will be appreciated by one skilled in the art, if curing is at relatively low temperatures and/or at relatively short times there will be a certain amount of aromatic polyamic acid present with the polyimide. Usually the amount of polyamic acid will be no more than about 5 to 10 mole % of the polyimide. When curing is complete, of course, there will be substantially no aromatic polyamic acid remaining. So as to reflect this concept, hereafter the at least partially cured layer resulting from the initial aromatic polyamic acid is referred to as a polyimide layer for purposes of brevity.

For preferred aromatic polyimides per the present invention, curing will typically be at from 120° to 400° C. for 20 to 60 minutes at normal ambient pressure.

IN SITU CONVERTING A SURFACE LAYER OF THE CURED AROMATIC POLYIMIDE TO AN SILICON CONTAINING ALKYL POLYAMIDE/IMIDE

The cured polyimide surface is converted to the silicon containing alkyl polyamide/imide barrier by exposing the surface of said layer to the alkyl amino silicon containing compound. Reaction can be by soaking in the liquid alkyl amino silicon containing compound or a solution of an alkyl amino silicon containing compound in a suitable non-reactive organic solvent such as an amide, ketone, ether, alcohol or combinations thereof with water. Concentrations of the alkyl amino silicon containing compound are generally from 10 to substantially 100% of the solution weight when a solution is used, with the caveat that at 100% the "solution" is pure compound, of course. Reaction can also occur in the refluxing vapors of the alkyl amino silicon containing compound or solutions of the compound. Reaction is typically at temperatures of from 20° to 200° C. Exposure to the soaking or refluxing alkyl amino silicon compound is generally for from 5 to 60 minutes. Generally, soaking the aromatic polyimide in a solution of 20 to 50% of alkyl amino silicon containing compound based on solution weight at temperatures of from 60° to 100° C. for 15 to 30 minutes provides adequate formation of the silicon containing alkyl polyamide/imide for creation of the oxygen reactive ion etch barrier.

As will be appreciated by one skilled in the art, if reaction is at elevated temperatures generally the silicon containing alkyl polyamide/imide will contain major proportions of the polyimide, with exposure at elevated temperature for long times resulting in substantially complete converstion to the polyimide form. On the other hand, if reaction is at a relatively low temperature for a relatively short time, substantial proportions of silicon containing alkyl polyamide will be present. Typically, however, both silicon containing alkyl polyamide and silicon containing alkyl polyimide will be present, and for this reason the term "silicon containing alkyl polyamide/imide" has been adopted.

The thickness of the suface layer of the cured polyamide which is converted to an silicon containing alkyl polyamide/imide is not unduly limited, but sufficient conversion must be achieved to provide the etch stop condition.

While it is extremely difficult to precisely determine the thickness of the surface layer which has been converted to the silicon containing alkyl polyamide/imide, nominally this is estimated to be on the order of a few hundred angstroms, generally nominally on the order of 500 to 1,000 angstroms.

SELECTIVE EXPOSURE OF THE SURFACE LAYER OF SILICON CONTAINING ALKYL POLYAMIDE/IMIDE

A conventional photoresist is applied, exposed through a mask and developed in a conventional manner to selectively expose desired areas of the surface layer of silicon containing alkyl polyamide/imide. The procedures of applying, exposing and developing the photoresist are well known in the art.

Useful photoresists include conventional diazoketone photoactivator resists containing novalac resins such as Shipley AZ 1350 and the same are typically exposed following the manufacturer's recommendations. Development is typically in a basic developer such as an inorganic hydroxide to optimize the desired slope and line width.

Photoresists useful in the present invention are not, of course, limited to the above, and positive photoresists which can be removed by conventional oxygen reactive ion etching are useful in the present invention.

At this stage of processing, areas of the silicon containing alkyl polyamide/imide where the etch stop is to be formed are protected by photoresist and areas of the silicon containing alkyl polyamide/imide which will be removed to permit eventual etching to the substrate are not protected by photoresist.

REACTIVE ION ETCHING THE SILICON CONTAINING ALKYL POLYAMIDE/IMIDE LAYER TO REMOVE THE SAME

The next step in the present invention is to reactive ion etch exposed areas of the silicon containing alkyl polyamide/imide surface layer to remove the exposed portions of the silicon containing alkyl polyamide/imide surface layer.

Reactive ion etching is with a material which will remove the converted silicon containing alkyl polyamide/imide surface layer.

Various reactive ion etching atmospheres can be used, for example those which form a volatile silicon compound such as $SiF_4$. The currently preferred reactive ion etching atmosphere is carbon tetrafluoride ($CF_4$).

Reactive ion etching conditions can be freely selected so long as the desired result of removing the alkyl silicon polyamide/imide is achieved as is known to those familiar with the art.

At this stage of the processing, the silicon containing alkyl polyamide/imide has been removed in all areas where etching is to be conducted down to the desired substrate but silicon containing alkyl polyamide/imide remains overcoated with photoresist at areas where the etch stop is to be formed.

INTERCONNECT FORMATION AND CONVERSION OF SILICON CONTAINING ALKYL POLYAMIDE/IMIDE TO SILICON DIOXIDE ETCH BARRIER

Conventional positive photoresists are generally removed by reactive ion etching in an oxygen atmosphere at a rate similar to aromatic polyimide.

Accordingly, in this stage of the process of the present invention the exposed polyimide is removed by reactive ion etching in an oxygen atmosphere as is the photoresist, the photoresist being removed at about the same rate as compared to the polyimide. Whereas prior to this invention usually a relatively thicker coating of photoresist was used as compared to the aromatic polyamic acid/polyimide so that photoresist removal was not accomplished prior to removal of the aromatic polyimide, in this invention a photoresist layer which is thinner than the aromatic polyimide can be used.

As soon as the photoresist is removed from the silicon containing alkyl polyamide/imide, the silicon containing alkyl polyamide/imide is in situ oxidized to silicon dioxide which prevents further oxygen reactive ion etching (oxygen attack) on the polyimide thereunder, reactive ion etching continuing with respect to the exposed polyimide until the desired degree of etching is achieved, thereby completing interconnect (or line) formation in the polyimide.

Reactive ion etching is conducted in an oxygen atmosphere typically at the following conditions: 125 millitorr oxygen at a flow of 62 SCCM and a power of 350 W or other suitable conditions known to one skilled in the art.

At the completion of oxygen reactive ion etching, the substrate (whatever its nature is) is exposed and the areas of silicon containing alkyl polyamide/imide formerly protected by the photoresist have been oxidized to silicon dioxide. As one skilled in the art will appreciate, it is not necessary that the silicon containing alkyl polyamide/imide layer be totally converted to silicon dioxide since even a thin layer of silicon dioxide will exhibit the etch stop function of the present invention. However, typically conversion is complete.

Having thus generally described the invention, the following working example is provided to illustrate the same in more detail.

EXAMPLE 1

As one skilled in the art will appreciate, the following example presents a model for fabrication of a semiconductor device interconnect. For purposes of illustration, however, formation of all contacts, doping procedures, etc., are not shown. However, these are conventional in the art.

In this particular instance, the substrates selected were $SiO_2$, $Si_3N_4$ and aluminum.

The aromatic polyimide was Dupont PI 5057, which is a solution of poly[N,N'-[p,p-oxydiphenylene]-pyromellitimide] having a weight average molecular weight of about 30,000 in an 80:20 vol. % mixture of NMP and a petroleum distillate.

It was spun onto the substrates as a 16 weight percent solution and then partially dried at 120° C. for 20 minutes at ambient pressure to yield an aromatic polyimide layer having a dry thickness of 2 microns.

The aromatic polyimide layer was then cured at 160° and 350° C. for 20 minutes each at ambient pressure.

Following the above procedure, a surface layer of the cured aromatic polyimide was in situ converted to the corresponding alkyl siloxane amide by immersing the substrate for 30 minutes in a 40% solution of bis(3-aminopropyl)tetramethyl disiloxane in diglyme (based on solution weight) held at 80° C. The substrate was washed in isopropanol, dried and heated to 180° C. for 10 minutes.

Thereafter, Shipley AZ 1350J was applied thereto (dry thickness ca. 50,000–60,000 angstroms), exposed through an appropriate mask and developed in Shipley AZ Developer to selectively expose the desired areas of the alkyl siloxane amide surface layer.

Thereafter, the exposed areas of the alkyl siloxane polyamide/imide surface layer were reactive ion etched in a carbon tetrafluoride ($CF_4$) atmosphere at the following conditions to remove all areas of the alkyl siloxane polyamide/imide surface layer not protected by photoresist: 150 SCCM, millitorr, 500 W.

Having thus exposed the remaining areas of the polyimide in areas where the alkyl siloxane polyamide/imide had been removed, oxygen reactive ion etching was conducted to etch an interconnect hole in the aromatic polyimide layer remaining (which was approximately 2 microns thick at the start of reactive ion etching) while simultaneously removing the photoresist down to the heretofore protected areas of the alkyl siloxane polyamide/imide layer.

In this procedure, the remaining alkyl siloxane polyamide/imide surface was reacted using oxygen reactive etching to thereby form a silicon dioxide etch barrier.

EXAMPLE 2

A cured aromatic polyimide layer, as in Example 1, was soaked for 30 minutes at 80° C. in a 25 wt.% solution of 3-aminopropyltriethoxysilane in diglyme/water (1:2). The substrate was rinsed in isopropanol, dried and heated to 180° C. for 10 minutes. Reactive ion etching under the conditions of Example 1 provided an excellent stop for the oxygen etch procedure.

EXAMPLE 3

A cured aromatic polyimide layer, as in Example 1, was suspended for 15 minutes in the refluxing vapors (165° C.) of a 50 wt.% solution of 3-aminopropylthiethoxysilane in diglyme. The substrate was rinsed in isopropanol and dried. This treatment formed an effective oxygen reactive ion etch barrier over the aromatic polyimide.

An etch barrier per the present invention can be used in forming devices, e.g., as disclosed in U.S. Pat. No. 4,001,870 Saiki et al., hereby incorporated by reference.

While there have been described what are at present considered to be the preferred embodiments of this invention, it will be obvious to those skilled in the art that various changes and modifications may be made therein without departing from the invention, and it is, therefore, intended to cover all such changes and modifications as fall within the true spirit and scope of the invention.

We claim:

1. A method of forming an etch barrier in the reactive ion etching of an aromatic polyamic acid/imide which comprises:

coating a surface with a layer of an aromatic polyamic acid;

at least partially curing the layer of aromatic polyamic acid to the corresponding aromatic polyimide;

in situ converting the surface layer of the aromatic polyimide to a silicon containing alkyl polyamide/imide;

applying, exposing, and developing a layer of photoresist over the silicon containing alkyl polyamide/imide to selectively expose a portion of the silicon containing alkyl polyamide/imide surface layer;

reactive ion etching the exposed portion of the surface layer of the silicon containing alkyl polyamide/imide with carbon tetraflouride to remove the exposed portion of the silicon containing alkyl polyamide/imide surface layer;

reactive ion etching the resultant structure with an oxygen agent to etch an interconnect in the aromatic polyimide while removing the photoresist down to the silicon containing alkyl polyamide/imide surface layer; and reacting the silicon containing alkyl polyamide/imide surface layer exposed upon removal of the photoresist by the oxygen reactive ion etching to thereby convert the same to a silicon dioxide etch barrier.

* * * * *